DOUBLE TANK DIODE PARAMETRIC AMPLIFIER

Filed Sept. 29, 1960 3 Sheets-Sheet 1

INVENTORS.
DWIGHT C. LEWIS
OLIVER I. STEIGERWALT
BY
ATTORNEY

INVENTORS.
DWIGHT C. LEWIS
OLIVER I. STEIGERWALT
BY
ATTORNEY

DOUBLE TANK DIODE PARAMETRIC AMPLIFIER

Filed Sept. 29, 1960 3 Sheets-Sheet 3

INVENTORS.
DWIGHT C. LEWIS
OLIVER I. STEIGERWALT
BY
ATTORNEY 3,094,672

DOUBLE TANK DIODE PARAMETRIC AMPLIFIER

Dwight C. Lewis, Goshen, Ind., and Oliver I. Steigerwalt, Akron, Ohio, assignors to Goodyear Aircraft Corporation, Akron, Ohio, a corporation of Delaware Filed Sept. 29, 1960, Ser. No. 59,211
2 Claims. (Cl. 330—4.9)

This invention relates to amplifiers for use throughout the radio frequency spectrum and especially to solid state devices for that purpose. It is particularly useful in affording low noise operation in the microwave region.

It is the general object of the invention to provide a double tank parametric amplifier utilizing a Varactor which will provide excellent signal amplification in the UHF–VHF range with a minimum development of noise.

Another object of the invention is to provide a parametric amplifier utilizing a signal tank and an idler tank in longitudinal alignment with a single Varactor mounted through a common wall between the tanks to couple the high impedance points of the tank circuits.

Another object of the invention is to provide in a double tank parametric amplifier an idler tank in conjunction with a Varactor, adapted to couple the idler energy out of the amplified signal frequency and dissipate this undesired noise energy.

Another object of the invention is to provide a double tank parametric amplifier which is sturdy and simple of construction, not subject to or effected by temperature variations, low in cost, small and light weight, and wherein the Varactor can be easily replaced.

The aforesaid objects of the invention and other objects which will become apparent as the description proceeds, are achieved by providing a parametric amplifier comprising a coaxial cavity resonant at the idler frequency, a second coaxial cavity resonant at the signal frequency, the cavities being in longitudinal alignment and being separated by an apertured shield, a junction diode located between the cavities in the aperture of the shield, means for applying a reverse bias to the diode, means for applying a signal frequency into the signal tank, means for taking an idler frequency out of the idler tank, means for pumping the diode with a signal at a frequency equal to the sum of the idler and signal frequencies, said reverse bias signal and pump signal terminating in their characteristic impedance to permit the flow of unimpeded idler and signal frequencies through the diode, and means to tune the frequency of the signal into the signal tank.

These and other objects will appear from the following description, reference being had to the accompanying drawings forming a part hereof.

Figure 1:
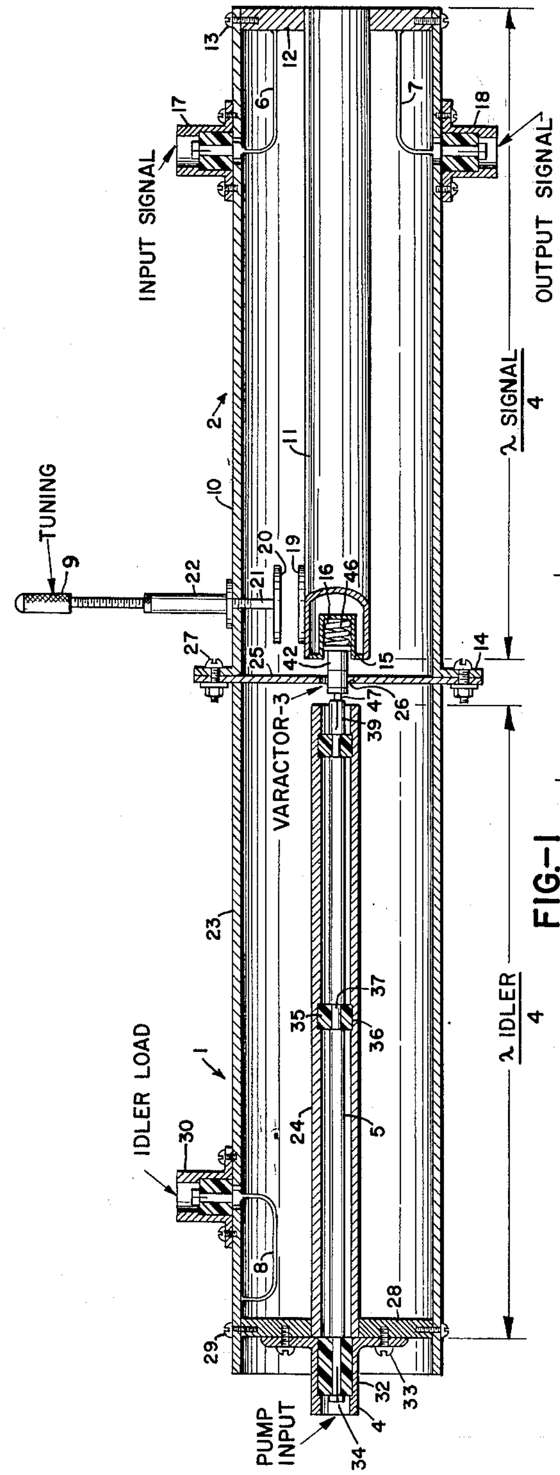
FIG. 1 is a longitudinal sectional view of a double tank parametric amplifier constructed in accordance with and embodying the invention.
Figure 2:
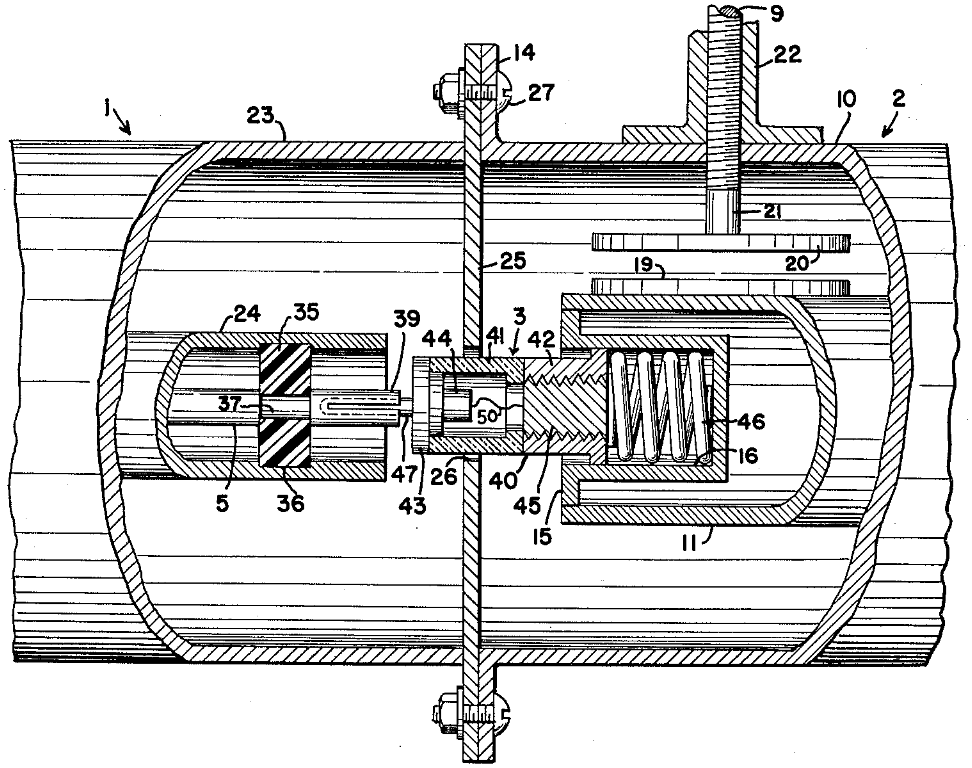
FIG. 2 is an enlarged detail view, partly broken away and partly in section, showing the junction diode and its mounting between the signal and idler tanks, a portion of the fine tuning mechanism of the signal tank being also shown, other portions being broken away.
Figure 3:
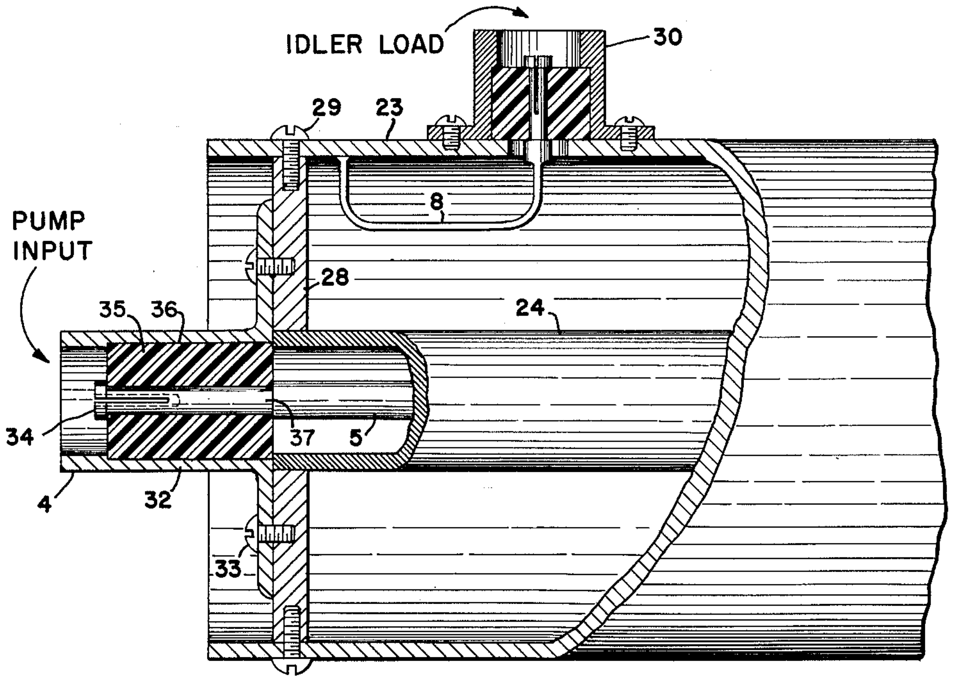
FIG. 3 is an enlarged detail view, partly broken away and partly in section, showing the pump input end of the idler tank, the idler load coupling loop being also shown, other parts being broken away.

Referring to the drawings, and first to FIGS. 1 to 3 thereof which show the mechanical structure of the invention, the apparatus generally comprises an idler tank 1, a signal tank 2 joined thereto end to end, a PN junction diode or Varactor 3 therebetween for coupling the tanks, a pump oscillator connection 4 and a coaxial inner conductor 5 for feeding pump oscillations and applying a bias voltage to the diode, input and output signal coupling loops 6 and 7 respectively, an idler load coupling loop 8 on the idler tank, and a variable capacity tuning means 9 on the signal tank.

The signal tank 2 includes an outer tubular conductor 10 of metal and coaxial therewith an inner tubular metal conductor 11. The inner conductor is shorter than the outer conductor and is conductively secured through a central aperture of a metal disc closure member 12 which is fitted in the one end of the outer tubular conductor 10. The total length of the inner conductor 11 and closure member 12 is made equal to one-fourth of the signal wave length. The closure member 12 may be secured within the end of the outer conductor by screws 13. The opposite end of the outer conductor 10 is flanged outwardly to provide a flange 14 for removably securing it to the idler tank.

The free end of the inner conductor 11 is closed by a metal disc 15 conductively secured thereto, as by solder or brazing, and the disc 15 is cupped inwardly to provide a cylindrical cavity 16 for receiving and supporting the diode 3, as hereinafter explained.

For coupling input and output signals to the signal tank 2, a pair of coaxial connectors 17, 18, each comprising a central contact insulated from an outer metal sleeve are mounted diametrically opposite one another near the closure member 12 and input coupling loop 6 is connected between the central contact of connector 17 and closure member 12, the outer sleeve of the connector 17 being grounded on the outer conductor 10. Likewise, the inner contact of connector 18 is connected by coupling loop 7 to closure member 12 within the tank while its outer sleeve is grounded on the outer conductor 10 at a diametrically opposite position.

While the signal tank may be tuned by axial adjustment of the closure member 12, fine tuning is provided by a variable capacitor 9 comprising a fixed plate 19 conductively secured to the inner conductor 11 near its free end and a movable plate 20 secured to a threaded spindle 21 engaged in a threaded sleeve 22 conductively secured to the outer conductor 10 and the spindle extending through an opening therein. This arrangement provides micrometer adjustment.

The idler tank 1 comprises an outer tubular metal conductor 23 of the same diameter as the outer conductor 10 of the signal tank and, coaxial therewith, a tubular metal inner conductor 24. The outer conductor 23 is conductively secured, as by soldering or brazing, at one end thereof, to a disc of metal 25 of larger diameter, having a central window or aperture 26 and providing a partial shield between the signal and idler tanks. The disc is of the same diameter as the flange 14 of the signal tank and is removably secured thereto about their margins by screws 27.

The inner tubular conductor is supported by and extends through a central aperture in a closure disc 28 of metal which slidably fits in the end of the outer conductor 23 and is conductively secured thereto near the end of the outer conductor by screws 29 permitting tuning adjustment. The total length of the inner conductor 24 and closure disc 28 is made equal to one-fourth of the idler wave length and the free end of the inner conductor is axially spaced from the shield 25.

Idler load coaxial connector 30 has its outer sleeve conductively secured through the wall of the outer conductor 23 near the closure disc 28 and its inner contact is conductively secured to the idler loop 8 within the conductor, the loop being grounded on the outer conductor 23 near the closure disc 28.

A pump input coaxial connector 4 is mounted on the outer face of the disc 28. Its outer sleeve 32 is flanged and grounded on the disc 28 by attaching screws 33. Its inner contact 34 is connected to the coaxial inner conductor 5 which extends axially through the inner tubular conductor 24.

The coaxial inner conductor 5 is supported coaxially within the tubular conductor 24 and is insulated therefrom by annular insulating members 35 at spaced intervals therealong, the insulators 35 are of polystyrene or other dielectric and those are held in annular grooves 36 of the tubular conductor 24 to prevent displacement. Annular grooves 37 are also provided on the coaxial inner conductor 5 which terminates in an axially split spring socket 39 supported by the last insulator against displacement.

The Varactor 3 comprises a removable cartridge 40 which includes a tubular ceramic insulating sleeve 41, an internally threaded tubular metal sleeve 42 secured to one end thereof, a metal terminal button 43 secured to the opposite end thereof, a PN crystal 44 secured to the metal button 43, a threaded plug 45 entered in the sleeve 42 and a wire 50 conductively connecting the exposed end of the PN crystal to the plug 45. The sleeve 42 has a radially flanged end which slidably fits in the cylindrical cavity 16. A compression coil spring 46 is seated in the cavity 16 to force the Varactor axially outward. The button 43 has an axial connecting pin 47 which enters the spring socket 39 detachably connecting it to the coaxial inner conductor 5. The arrangement is such that by removing screws 27 the tanks may be separated and the Varactor removed or replaced and when in place one terminal of the Varactor contacts the inner conductor of the signal tank and the other terminal contacts the pump input coaxial inner conductor 5 while the tubular insulator sleeve 41 is located within the opening 26 of the shield 25.

Figure 4:
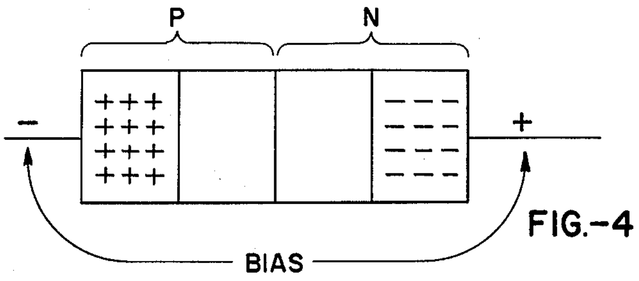
FIG. 4 is a diagrammatic representation of a PN junction diode having a bias voltage applied thereto for operation as a variable capacity diode.

A variable capacity diode, known as a Varactor, is shown diagrammatically in FIG. 4. These diodes are biased in the reverse direction as indicated. The charges in the N material and the holes in the P material are attracted by the bias potential away from the junction. An imaginary boundary is formed for the charges in each material and may be considered as the plates of a capacitor. If a voltage is impressed across the back-biased diode at some frequency, the capacity will now vary as a function of this voltage and frequency.

Figure 5:
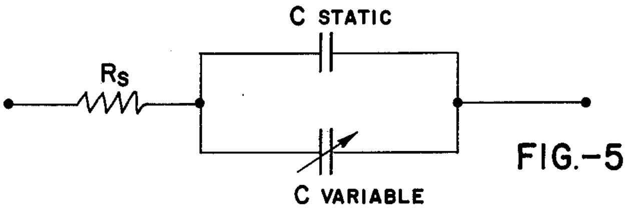
FIG. 5 is a diagram showing the equivalent circuit of the diode of FIG. 4.

The equivalent circuit of the Varactor is shown in FIG. 5. The cutoff frequency is used as the figure of merit. It is that frequency where the reactance of the static capacity is equal to the series resistance. In the equivalent circuit the static capacity is shown as C static or $C_s$ and the variable capacity as C variable or $C(v)$. The series resistance is represented as $R_s$. The cutoff frequency is represented by $f_{co}$.

$$R_s=\frac{1}{2\pi f_{co}C_s}$$

$$f_{co}=\frac{1}{2\pi R_sC_s}$$

Varactors are used at a maximum frequency of 1/20 of the cutoff frequency (Q=20) for good performance. Such Varactors having cutoff frequencies of 20 to 1000 mc. or kmc. are available for use up to the "S" band and are being developed for use in the "X" band.

The parametric amplifier is a solid state device affording low noise operation in the microwave region without the necessity of special cooling or magnetic field. Its essential elements are parallel resonant circuits and diodes. Such devices therefore may be relatively small, of light weight, and rugged, and the prime power consumed is quite nominal. For successful operation and external "pump" oscillator is required, and the amplifier bandwidth obtainable with a single stage for reasonable gain and noise figures is rather limited.

Figure 6:
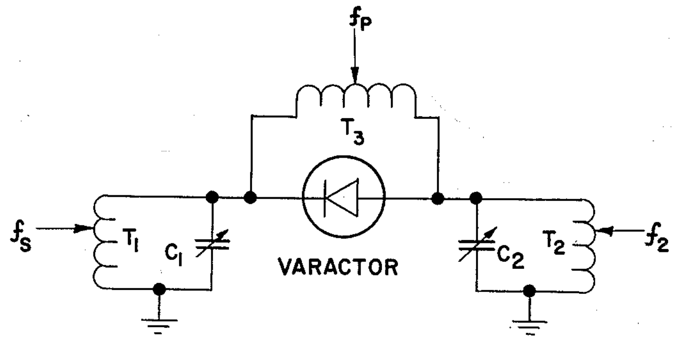
FIG. 6 is a diagrammatic showing of the circuit of a parametric amplifier.

The parametric amplifier circuit shown in FIG. 6 is applicable throughout the radio frequency spectrum. It is shown there in lumped constants and may take on various mechanical configurations depending upon frequency. It comprises two non-resonant tank circuits $T_1$ and $T_2$ coupled by a Varactor with means $T_3$ whereby a voltage can be applied across the Varactor by a local oscillator (pump oscillator). Such an amplifier may be operated as an up or UP convertor, as a down convertor or as a straight-through amplifier.

When arranged as an UP convertor, T is tuned to the signal frequency and $T_2$ is tuned to the sum of the signal and pump frequencies. A power gain is now available at $W_2$ in $T_2$ relative to the applied signal voltage at $W_1$.

$$\text{The power gain}=\frac{W_2}{W_s}=\frac{W_s+W_p}{W_s}$$

It will be noted that the phase relations have cancelled out and the power gain is independent of the tuned circuit impedances. The band width limitation of the UP converter is approximately the band width of the tuned circuit having the narrowest band pass.

The parametric Down convertor is operated with $T_2$ tuned to the difference between the pump and signal frequencies. $W_2=W_p-W_s$. All other circuit parameters are as with the UP convertor. Power gain is now the negative ratio of the signal and difference frequencies.

$$\text{Power gain}=-\frac{W_2}{W_s}=\frac{-(W_p-W_s)}{W_s}$$

A negative power gain indicates a regenerative circuit. Power gain is now available at either $T_1$ or $T_2$, and thus the circuit finds application as a straight-through amplifier. The power gain equation given above is not descriptive of gain relative to the applied signal voltage, but simply states a relation between the power levels in $T_1$ and $T_2$.

Figure 7:
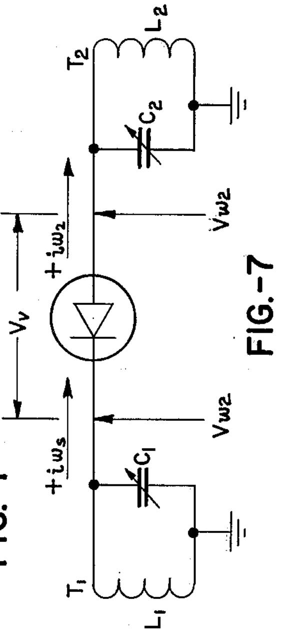
FIG. 7 is an equivalent circuit diagram of the double tank parametric amplifier of this invention.

FIGURE 7 shows the equivalent electric circuit of the double tank parametric amplifier shown mechanically in FIGURES 1 to 3. A suitable Varactor 3 is that made by Microwave Associates and known as MA-460-A varactor diode. The Varactor 3 is used to couple the high impedance points of the resonant circuits $T_1$ and $T_2$. The Varactor 3 is pumped by an external oscillator, not shown, but operated at a frequency equal to the sum of the idler and signal frequencies. The oscillator connects at pump input 4 and to inner contact 34 and coaxial inner conductor 5.

The device illustrated in FIGS. 1 to 3 is usable for amplifying signals in the range of 115 to 150 mc. The idler tank is antiresonant at 210 mc. and is pumped by a 100 mw. oscillator operated at the sum of the signal and idler frequencies. A power gain of 20 decibels with a .5 mc. band width is easily obtained. Accurate measurements indicate a noise figure of 2 decibels.

Thus the objects of the invention have been accomplished.

While the specific embodiment disclosed has been employed at relatively low frequencies, experiments therewith indicate that similar devices could be constructed for use throughout the radio spectrum.

While a certain representative embodiment and details have been shown for the purpose of illustrating the invention, it will be apparent to those skilled in the art that various changes and modifications may be made therein without departing from the spirit or scope of the invention.

What is claimed is:

1. A parametric amplifier comprising a pair of closed metal cavities arranged end to end and separated by a conductive shield having an opening therethrough, one cavity being resonant to an idler frequency, the other being resonant to a signal frequency, a junction diode located through the opening of said shield and insulated therefrom, said diode having one terminal within one cavity and an opposite terminal within the other cavity, means coupling the idler cavity to an idler load, means coupling the signal cavity to a signal input and a signal output, conductive means extending coaxially of said signal cavity for supporting said diode and connecting one terminal thereof to the high impedance point of the signal cavity, tubular conductive means extending coaxially of said idler cavity and spaced from said shield and grounded on said idler cavity at its high impedance point, means for applying a reverse bias to and for pumping said diode at a frequency equal to the sum of the idler and signal frequencies, and a coaxial line extending through said tubular conductive means and insulated therefrom connecting the biasing and pumping means with the the diode, said coaxial line having its inner conductor connected conductively to the opposite terminal of said diode and its shield grounded on said idler cavity at the high impedance point thereof, and means to couple the idler energy out of the idler tank and dissipate it to a receiving load means.

2. A parametric amplifier comprising a pair of metal cavities each including coaxial tubular inner and outer members connected at one end thereof by annular metal closure members, the inner tubular members being of less length than the outer members and being respectively one-fourth wave length of a signal frequency and an idler frequency, a centrally apertured partial shield of metal mounted conductively between the open ends of the cavities, a PN junction diode extending through the central aperture of the shield and insulated therefrom, said diode having one terminal conductively secured in the free end of the inner tubular member of the signal cavity and its opposite terminal in the idler cavity, means for coupling the signal cavity to a signal input and a signal output, means for coupling said idler cavity to an idler load, means for applying a reverse bias to and for pumping said diode at a frequency equal to the sum of the idler and signal frequencies, and a coaxial line extending through and insulated from the inner tubular member of said idler cavity with its inner conductor connected to said opposite terminal of said diode and biasing and pumping means and its outer conductor grounded on said idler cavity closure member at the high impedance point of said idler cavity.

References Cited in the file of this patent

UNITED STATES PATENTS

| | | |
|---|---|---|
| 2,616,037 | Wheeler et al. | Oct. 28, 1952 |
| 3,016,495 | Tien | Jan. 9, 1962 |

FOREIGN PATENTS

| | | |
|---|---|---|
| 1,073,557 | Germany | Jan. 21, 1960 |
| 1,228,390 | France | Mar. 14, 1960 |
| 1,084,785 | Germany | July 7, 1960 |

OTHER REFERENCES

Reed: "IRE Transactions on Electron Devices," April 1959, pp. 216–224.

Chang et al.: "Proceedings of the IRE," July 1958, pp. 1383–1386.

Weber: "Electronics," April 17, 1959, p. 39.

Heffner et al.: "Journal of Applied Physics," September 1958, pp. 1321–1331.